(12) United States Patent
Yamakawa et al.

(10) Patent No.: US 6,373,108 B2
(45) Date of Patent: *Apr. 16, 2002

(54) SEMICONDUCTOR DEVICE HAVING REDUCED SHEET RESISTANCE OF SOURCE/DRAIN REGIONS

(75) Inventors: Satoshi Yamakawa; Yasunori Tokuda; Takumi Nakahata; Taisuke Furukawa; Shigemitsu Maruno, all of Hyogo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/259,336

(22) Filed: Mar. 1, 1999

(30) Foreign Application Priority Data

Sep. 14, 1998 (JP) ............................................. 10-259777

(51) Int. Cl.[7] ......................... H01L 29/76; H01L 29/94
(52) U.S. Cl. ......................... 257/382; 257/383; 257/384
(58) Field of Search ................................ 257/384, 383, 257/382, 900; 438/300

(56) References Cited

U.S. PATENT DOCUMENTS 5,677,214 A * 10/1997 Hsu ............................ 438/297
5,953,605 A * 9/1999 Kodama ..................... 438/231

FOREIGN PATENT DOCUMENTS

JP 5-226650 * 9/1993

OTHER PUBLICATIONS

"Ultra–Shallow In–Situ–Doped Raised Source/Drain Structure for Sub–Tenth Micron CMOS", by Nakahara et al., 1996 Symposium on VLSI Technology Digest of Technical Papers, pp. 174–175.
"A Super Self–Aligned Source/Drain MOSET", by Lau et al., IEDM 87, pp. 358–361.
"High Perfomance Half–Micron PMOSFETs with 0.1UM Shallow P N Junction Utilizing Selective Silicon Growth and Rapid Thermal Annealing", by Shibata et al., IEDM 87, pp. 590–593.

* cited by examiner

*Primary Examiner*—Steven Loke
*Assistant Examiner*—Hung Kim Vu
(74) *Attorney, Agent, or Firm*—McDermott, Will & Emery

(57) ABSTRACT

Source/drain diffusion regions are formed on the silicon substrate such that the source/drain diffusion regions sandwich a gate electrode from both sides on the silicon substrate. Sidewall oxide films are formed, one on each side surface of the gate electrode. Recessed portions are formed in the extension portions E beneath the sidewall oxide films. Source/drain electrodes are formed to fill the recessed portions. Thus, the sheet resistance of the respective regions including a pair of source/drain diffusion regions and source/drain electrodes is reduced, and a semiconductor device with a field-effect transistor having an improved current drivability is obtained.

7 Claims, 14 Drawing Sheets

SEMICONDUCTOR DEVICE HAVING REDUCED SHEET RESISTANCE OF SOURCE/DRAIN REGIONS

BACKGROUND OF THE INVENTION

1. Field of the Invention

The present invention relates a semiconductor device and a method of manufacturing the device, and more specifically, to a semiconductor device with a field-effect transistor having an improved current drivability and a method of manufacturing such a device.

2. Description of the Background Art

As an example of a conventional semiconductor device, a semiconductor device having a field-effect transistor will be described below in relation to the drawings. As seen from FIG. 21, a pair of source/drain diffusion regions 105a, 105b positioned at a prescribed interval are formed on a surface of a silicon substrate 101. On the region of silicon substrate 101 located between the pair of source/drain diffusion regions 105a, 105b a gate electrode 104a is formed, with a gate oxide film 103a formed therebetween. Gates sidewall oxide films 106a, 106b are formed, one on each side surface of gate electrode 104a. A source/drain electrode 107a is formed on the surface of a source/drain diffusion region 105a. Moreover, a source/drain electrode 107b is formed on the surface of a source/drain diffusion region 105b. A gate upper electrode 107c is formed on gate electrode 104a.

In the above-described manner, the main portion of a semiconductor device having a field-effect transistor is formed on silicon substrate 101. The field-effect transistor is electrically isolated from another field-effect transistor (not shown) by an element isolating oxide film 102 formed in silicon substrate 101.

Now, an example of a method of manufacturing the above-described semiconductor device will be described with reference to the drawings. As shown in FIG. 22, element isolating oxide film 102 is formed on the surface of silicon substrate 101 by trench isolation method. Then, as shown in FIG. 23, a silicon oxide film 103 is formed on the surface of silicon substrate 101 using thermal oxidation method or the like. On silicon oxide film 103, a polysilicon film 104 is formed by CVD (Chemical Vapor Deposition) method or the like. On polysilicon film 104, a photo resist (not shown) is provided, and a photo resist pattern 108 is formed by the use of an appropriate photolithography.

Now, as shown in FIG. 24, using photo resist pattern 108 as a mask, polysilicon film 104 and silicon oxide film 103 are anisotropically etched to form gate electrode 104a and gate oxide film 103a. Thereafter, photo resist pattern 108 is removed.

Next, as shown in FIG. 25, using gate electrode 104a as a mask, an impurity of a prescribed conductivity type is implanted into a surface of silicon substrate 101 using ion implantation method to form a pair of source/drain diffusion region 105a, 105b, respectively. Then, as shown in FIG. 26, a silicon oxide film 106 is formed on silicon substrate 101 to cover gate electrode 104a by CVD method.

Next, as shown in FIG. 27, silicon oxide film 106 is etched anisotropically to form gate sidewall oxide films 106a, 106b, each of which is formed respectively on each side surface of gate electrode 104a. Then, as shown in FIG. 28, silicon is epitaxially grown selectively on gate electrode 104a and source/drain diffusion regions 105a, 105b by epitaxial growth method to form gate upper electrode 107c and source/drain electrodes 107a, 107b, respectively. In this manner, the main portion of the semiconductor device having the field-effect transistor shown in FIG. 21 is completed.

In recent years, miniaturization of field-effect transistors has been promoted in order to keep up with the higher degrees of integration achieved in semiconductor devices. As a field-effect transistor is miniaturized, its gate length is reduced, which leads to a lower threshold voltage, causing the so-called short-channel effect leading to the incorrect operation of the field-effect transistor. Conventionally, in order to prevent the short-channel effect in such a field-effect transistor, the film thickness of the gate oxide film has been reduced, or the depth of a source/drain region (or the depth of junction) has been made smaller. With a smaller depth of the source/drain region, however, the electrical resistance (sheet resistance) in the source/drain region cannot be sufficiently lowered, and the amount of the current flowing through the source/drain region becomes smaller. As a result, problems such as lowering of the current drivability in the field-effect transistor arise, leading to a decreased operation speed. Conventionally, in order to prevent such problems, conductive layers, i.e. source/drain electrodes 107a, 107b, are formed on the surfaces of the source/drain regions to reduce the sheet resistance of the source/drain regions, thereby ensuring the current drivability of the field-effect transistor.

In the above-described semiconductor device, however, source/drain electrodes 107a, 107b were not formed on the portions (extension portions E) located beneath gate sidewall oxide films 106a, 106b on the surfaces of source/drain diffusion regions 105a, 105b. Therefore, it was impossible sufficiently to reduce the sheet resistance of source/drain diffusion regions 105a, 105b in extension portions E. Consequently, further improvement in the current drivability of the field-effect transistor was limited.

SUMMARY OF THE INVENTION

The present invention was made to solve the above problems. An object of the present invention is to provide a semiconductor device having an improved current drivability. Another object of the present invention is provide a method of manufacturing such a semiconductor device.

According to one aspect of the present invention, the semiconductor device is provided with a semiconductor substrate having a main surface, an electrode, a pair of conductive regions, and sidewall insulating films. The electrode is formed on the main surface of the semiconductor substrate with an insulating film therebetween. The pair of conductive regions are formed on the semiconductor substrate such that the conductive regions sandwich the electrode from both sides. The sidewall insulating films are formed one on each side surface of the electrode, and recessed portions are formed exposing the main surface of the semiconductor substrate. Further, the pair of conductive regions include impurity regions respectively formed on the main surface of the semiconductor substrate such that the impurity regions sandwich the electrode from both sides, and conductive layers formed on the impurity regions to fill the recessed portions.

According to this construction, a field-effect transistor (simply referred to as a "transistor" below) including an electrode and a pair of conductive regions is formed on the semiconductor substrate. In the transistor, recessed portions exposing the main surface of the semiconductor substrate are formed in the sidewall insulating films provided one on each side surface of the electrode. Moreover, conductive layers in the pair of conductive regions are formed on the impurity regions to fill the recessed portions. Therefore, a conductive layer is also formed between the sidewall insulating film and the impurity region located beneath the sidewall insulating film. As a result, in comparison with the construction of a conventional semiconductor device in which a conductive layer is not formed between the sidewall insulating film and the impurity region, the sheet resistance of the conductive region can be further reduced. Consequently, the amount of current that flows through the conductive regions increases, leading to an improved current drivability of the field-effect transistor as well as an improved operation speed, among others, of the transistor.

The semiconductor substrate, preferably, is a silicon single crystal substrate, and the conductive layer is epitaxially grown silicon or silicon germanium.

In this case, the conductive layer can be easily formed on the impurity region in a self-aligned manner.

In addition, the conductive layer preferably contains a metal. In this case, the sheet resistance of the pair of conductive regions can be further reduced, resulting in an improved current drivability of the transistor.

Further, the semiconductor substrate, preferably, is a silicon substrate, and the conductive layer contains a metal silicide formed by reacting the silicon in the silicon substrate with a metal.

In this case, the conductive layer containing the metal silicide can be easily formed on the impurity region in a self-aligned manner.

In another aspect of the present invention, a method of manufacturing the semiconductor device includes the following steps. An electrode is formed on the main surface of the semiconductor substrate with a first insulating film therebetween. A second insulating film is formed on the semiconductor substrate to cover the electrode. By anisotropically etching the second insulating film, sidewall insulating films are formed one on each side surface of the electrode. A pair of conductive regions are formed on the semiconductor substrate such that the conductive regions sandwich the electrode. The step of forming the sidewall insulating films includes a recessed portion forming step or the step of forming on the sidewall insulating films recessed portions exposing the surface of the semiconductor substrate by removing the portions of the sidewall insulating films in contact with and in the vicinity of the main surface of the semiconductor substrate which were damaged by anisotropic etching. The step of forming a pair of conductive regions includes the step of forming a pair of impurity regions respectively on the main surface of the semiconductor substrate such that the impurity regions sandwich the electrode from both sides, and the step of forming conductive layers electrically connected to the impurity regions upon the main surface of the semiconductor substrate including exposed surfaces to fill the recessed portions.

According to this manufacturing method, a transistor having an electrode and a pair of conductive regions is formed on a semiconductor substrate. In sidewall insulating films provided one on either side surface of the electrode of the transistor, recessed portions exposing a surface of the semiconductor substrate are formed. Portions of the sidewall insulating films in the vicinity of the surface of the semiconductor substrate suffer more damage than other portions from the irradiation of ions or electrons or the like on the surface of the semiconductor substrate upon the formation of the sidewall insulating films by the anisotropic etching of the second insulating film. Since the recessed portions are formed by removing the portions of the sidewall insulating films having suffered more of the damage, the recessed portions can be formed fairly easily. Moreover, by forming the conductive layers to fill the recessed portions, the conductive layers will also be formed between the sidewall insulating films and the impurity regions located beneath the sidewall insulating films. Thus, the sheet resistance of the conductive regions can be further reduced than in the conventional semiconductor device structure having no conductive layer formed between the sidewall insulating films and the impurity regions. As a result, a semiconductor device with a transistor having a greater current drivability can be produced with ease.

As described above, the recessed portions are formed in the portions of the sidewall insulating films which have suffered more damage by anisotropic etching. Degradation in the film quality such as weakened bond strength in the damaged portions is observed in comparison with other portions. Thus, it is desirable to form the recessed portions by vaporizing the damaged portions of the sidewall insulating films by heat treatment. Since the bond strength of the sidewall insulating films is weakened in the damaged portions, the damaged portions are more readily vaporized than other portions through heat treatment, and the recessed portions are formed without difficulty.

In addition, the heat treatment is performed preferably at a temperature of 850° C. or above with the degree of vacuum being $\times 10^{-6}$ Torr or below. With these conditions, the damaged portions are nearly fully vaporized It is also desirable to form the recessed portions by removing the damaged portions by isotropic etching. The film in the damaged portions is less dense than in other portions, which leads to a faster etching rate. Thus, the recessed portions can be formed without difficulty.

As to the sidewall insulating films, specifically, an insulating film selected from the group consisting of a silicon oxide film, a silicon nitride film, and a silicon oxynitride film may be used.

In addition, the semiconductor substrate is a silicon single crystal substrate. Moreover, the step of forming the conductive layers preferably includes an epitaxial growth step or the step of forming the conductive layers by silicon epitaxial growth method.

In this case, the conductive layers can be formed easily and in a self-aligned manner on the impurity regions formed on the surface of the semiconductor substrate.

The epitaxial growth step preferably includes the step of forming the conductive layers such that voids do not form between the growing silicon and the sidewall insulating films and that faceting does not occur at an edge of the growing silicon on the main surface of the semiconductor substrate exposed by the recessed portions. In this case, voids do not form in the vicinity of the transistor so that the transistor reliability is improved.

Moreover, preferably, the recessed portion forming step is performed inside an appropriate chamber followed by the epitaxial growth step performed inside the same chamber.

In this case, the cleanliness of the semiconductor substrate surface, particularly before the epitaxial growth step, is retained, allowing the stable growth of a silicon epitaxial growth layer.

The step of forming a pair of impurity regions preferably and specifically includes, after the recessed portion forming step, the step of introducing into the main surface of the semiconductor substrate an impurity of a prescribed conductivity type by ion implantation method. Particularly, during ion implantation, it is more desirable to introduce the impurity ions of the prescribed conductivity type into the main surface of the semiconductor substrate by oblique rotational ion implantation. In this case, the impurity ions may be easily introduced into the surface of the semiconductor substrate beneath the recessed portions.

Moreover, the step of forming a pair of impurity regions alternatively may involve, after forming the conductive layers, introducing the impurity into the surface of the semiconductor substrate through the conductive layers by ion implantation method.

Furthermore, the step of forming a pair of impurity regions may include the step of introducing the impurity of the prescribed conductivity type into the conductive layers, and thereafter, the step of forming the impurity regions by diffusing the impurity into the main surface of the semiconductor substrate. In this case, the impurity regions can be formed without difficulty.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
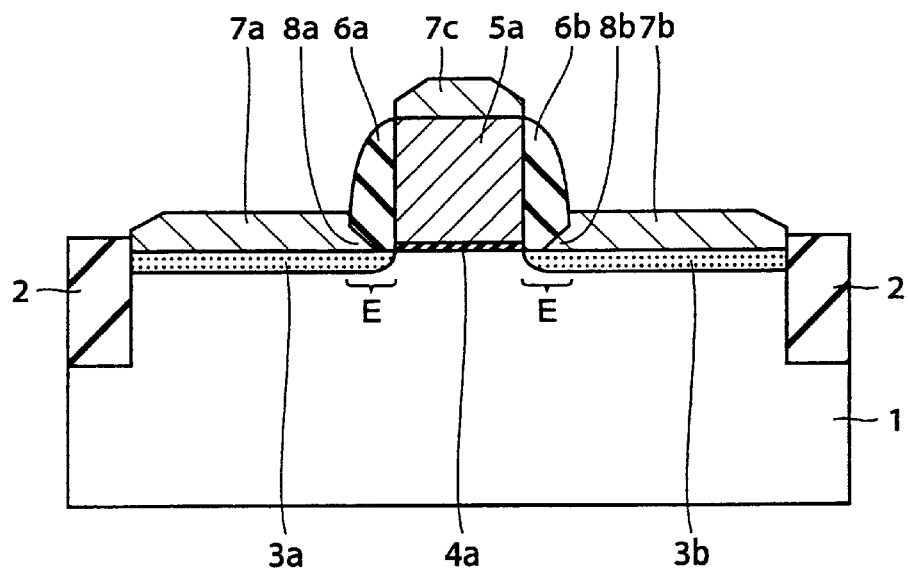
FIG. 1 is a cross sectional view of the semiconductor device according to the first embodiment of the present invention.

The semiconductor device having the transistor according to the first embodiment of the present invention will be described with reference to the drawing. As shown in FIG. 1, a gate electrode 5a is formed on the surface of a silicon substrate 1 with a gate oxide film 4a therebetween. A pair of source/drain diffusion regions 3a, 3b are formed on silicon substrate 1 such that the source/drain diffusion regions 3a, 3b sandwich gate electrode 5a from both sides. Sidewall oxide films 6a, 6b are formed, one on each side surface of gate electrode 5a. On sidewall oxide films 6a, 6b, respectively, recessed portions 8a, 8b are formed exposing the surface of silicon substrate 1. Source/drain electrodes 7a, 7b are respectively formed on source/drain diffusion regions 3a, 3b to fill recessed portions 8a, 8b. In addition, a gate upper electrode 7c is formed on the upper surface of gate electrode 5a. Thus, the main portion of the semiconductor device having the transistor is configured in the above-described manner.

Further, the transistor formed on silicon substrate 1 is electrically isolated by an element isolating oxide film 2 from a transistor (not shown) formed in another region.

Figure 28:
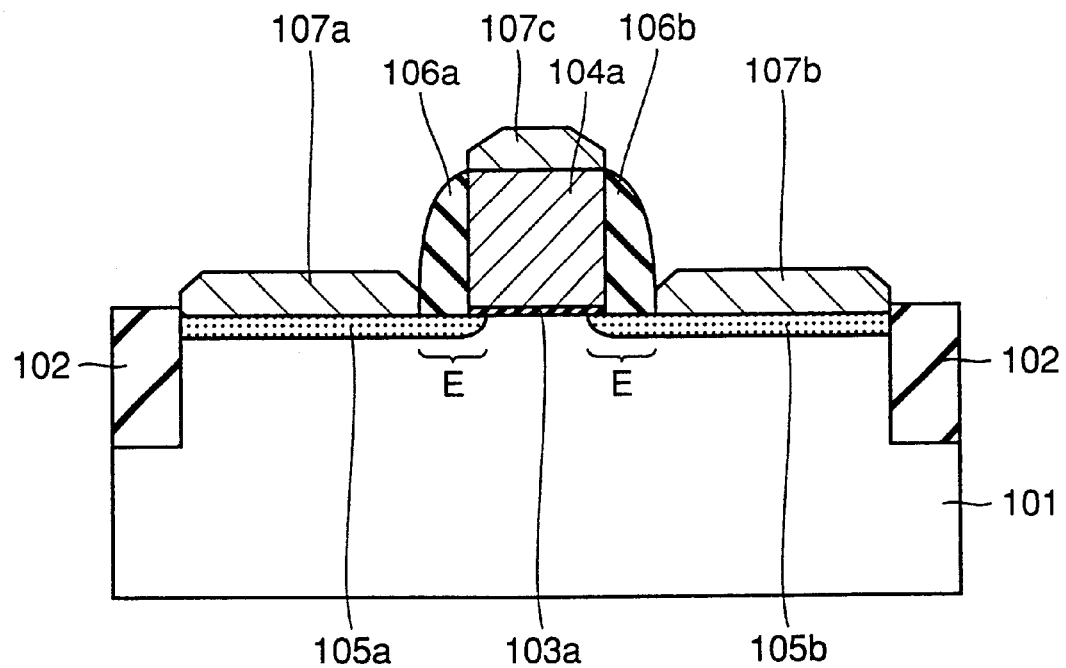
FIG. 28 is a cross sectional view for describing the problems pertaining to the conventional semiconductor device.

In the transistor of the above-described semiconductor device, recessed portions 8a, 8b exposing the surface of silicon substrate 1 are formed in sidewall oxide films 6a, 6b each of which is provided on each side surface of gate electrode 5a. Moreover, source/drain electrodes 7a, 7b are formed on source/drain diffusion regions 3a, 3b to fill recessed portions 8a, 8b. Therefore, source/drain electrodes 7a, 7b, respectively, are also formed between sidewall oxide films 6a, 6b and source/drain diffusion regions 3a, 3b located beneath sidewall oxide films 6a, 6b. Thus, when compared with the conventional semiconductor device structure (see FIG. 28) where source/drain electrodes 7a, 7b are not formed in the portions (extension portions E) between sidewall oxide films 6a, 6b and source/drain diffusion regions 3a, 3b, the presence of source/drain electrodes 7a, 7b in the extension portions E allows a further reduction in the sheet resistance in the regions including source/drain diffusion regions 3a, 3b and source/drain electrodes 7a, 7b. As a result, the short-channel effect of the transistor is reduced, while the amount of current flowing through source/drain diffusion regions 3a, 3b and source/drain electrodes 7a, 7b increases, leading to an improved current drivability and operation speed of the transistor.

Moreover, as will be described below, epitaxially grown silicon or silicon germanium may be used for source/drain electrodes 7a, 7b. In addition, a metal such as tungsten or titanium, or a metal silicide which is a compound of one such metal and silicon may be used. When using a metal or a metal silicide for source/drain electrodes 7a, 7b, the current flowing through source/drain diffusion regions 3a, 3b and source/drain electrodes 7a, 7b increases, resulting in an improved current drivability of the transistor.

Further, as will be described below, silicon oxide films may be used as sidewall oxide films 6a, 6b. Silicon nitride films or silicon oxynitride films may also be used.

Second Embodiment

Figure 2:
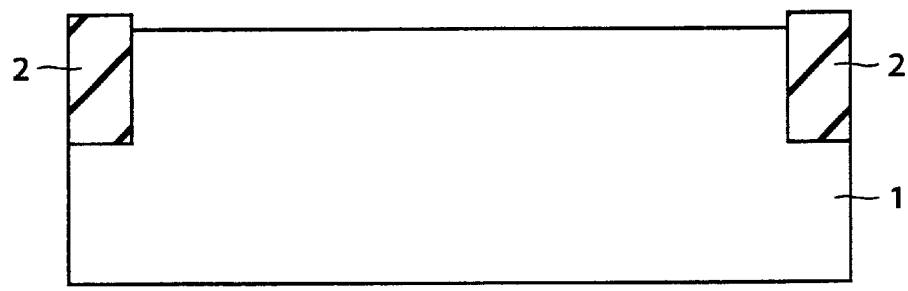
FIG. 2 is a cross sectional view showing a step of the manufacturing method of the semiconductor device according to the second embodiment of the present invention.
Figure 3:
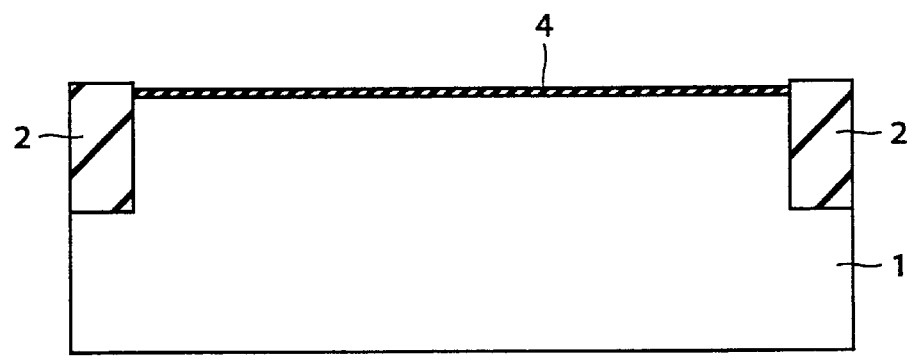
FIG. 3 is a cross sectional view showing the step performed after the step shown in FIG. 2 according to the second embodiment.

An example of the method of manufacturing the semiconductor device described in relation to the first embodiment will be described with reference to the drawings as a method of manufacturing the semiconductor device according to the second embodiment of the present invention. As shown in FIG. 2, an element isolating oxide film 2 is formed in a silicon substrate 1 using the trench isolation method. Then, as shown in FIG. 3, a silicon oxide film 4 is formed on the surface of silicon substrate 1 by thermal oxidation or the like.

Figure 4:
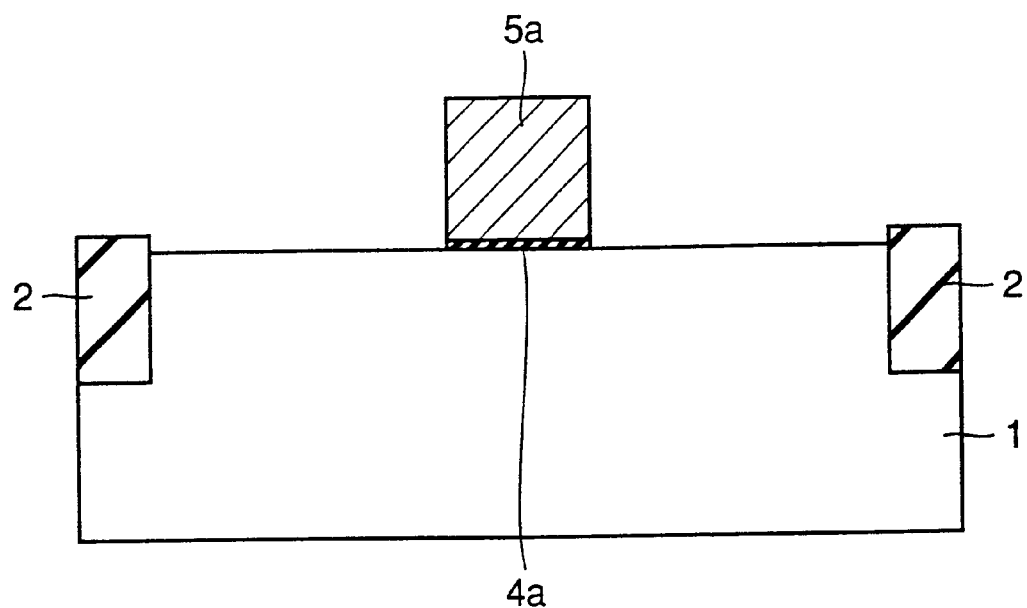
FIG. 4 is a cross sectional view showing the step performed after the step shown in FIG. 3 according to the second embodiment.

Then, as shown in FIG. 4, a polysilicon film (not shown) is formed on silicon oxide film 4 using CVD method, and on the polysilicon film, a prescribed resist pattern (not shown) is formed. Using the resist pattern as a mask, the polysilicon film is etched anisotropically to form a gate electrode 5a and a gate oxide film 4a.

Figure 5:
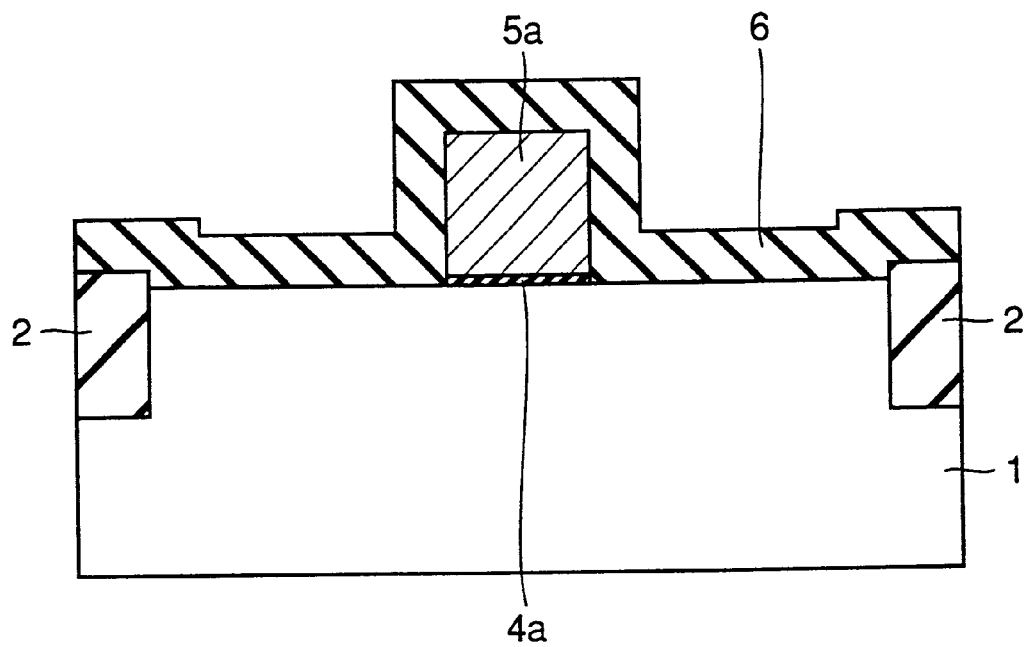
FIG. 5 is a cross sectional view showing the step performed after the step shown in FIG. 4 according to the second embodiment.
Figure 6:
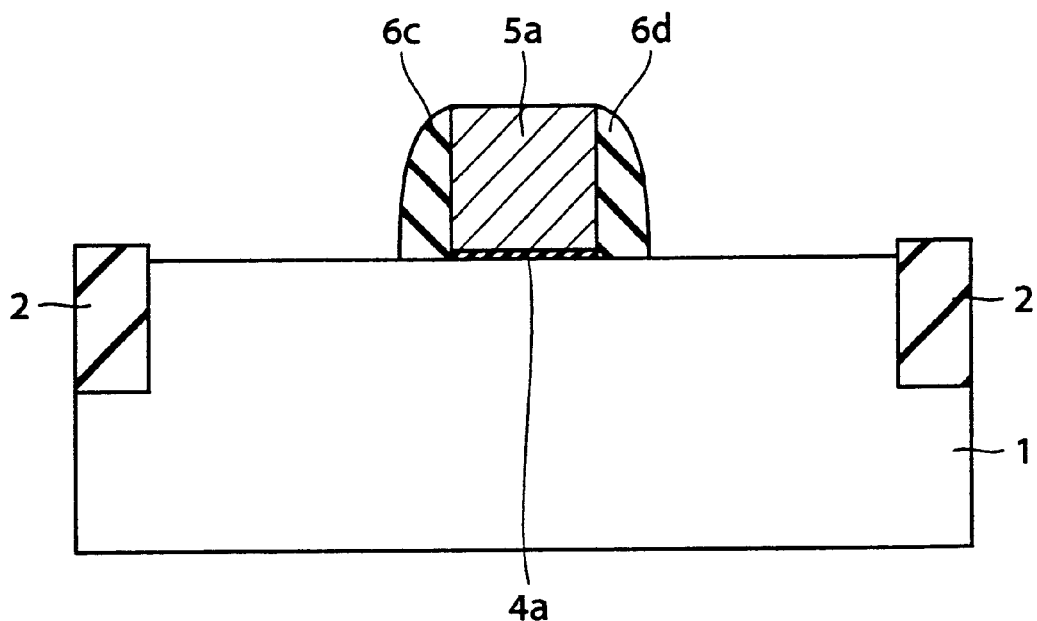
FIG. 6 is a cross sectional view showing the step performed after the step shown in FIG. 5 according to the second embodiment.

Next, as shown in FIG. 5, a silicon oxide film 6 is formed on silicon substrate 1 by CVD method covering gate electrode 5a. Then, as shown in FIG. 6, silicon oxide film 6 is anisotropically etched to form sidewall oxide films 6c, 6d, one on each side surface of gate electrode 5a. During anisotropic etching, the portions of sidewall oxide films 6c, 6d close to the surface of silicon substrate 1 suffer more damage than other portions from the irradiation of ions or electrons on the surface of silicon substrate 1. In the damaged portions of the sidewall oxide films, degradation in the film quality such as weakened the bond strength is observed in comparison with other portions.

Figure 7:
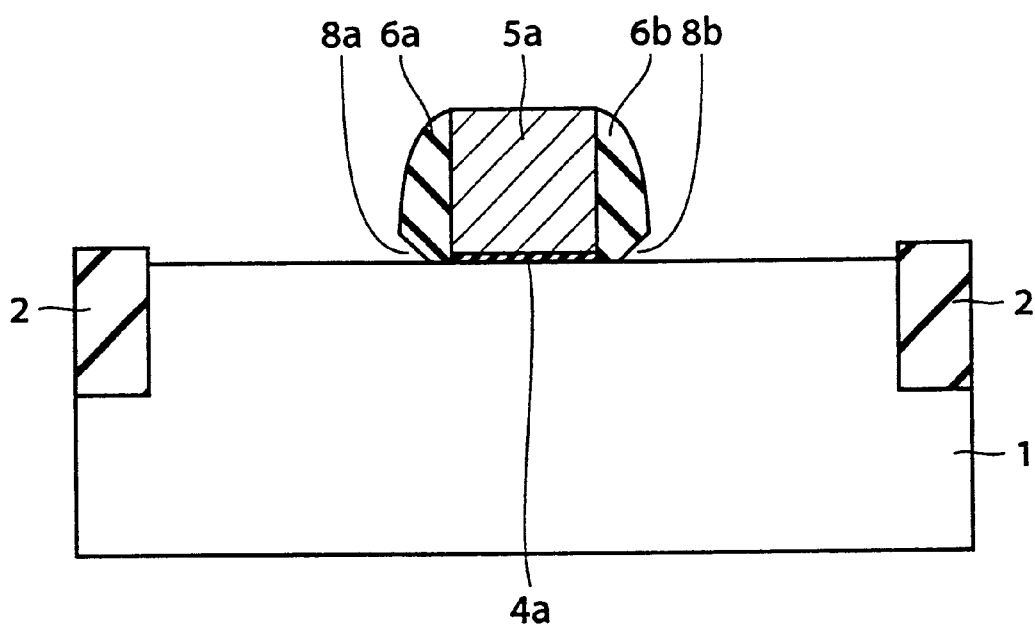
FIG. 7 is a cross sectional view showing the step performed after the step shown in FIG. 6 according to the second embodiment.

Then, as shown in FIG. 7, heat treatment is performed at a pressure of $1\times10^{-8}$ Torr at 900° C. At this time, the damaged portions of sidewall oxide films 6c, 6d vaporizes to form recessed portions 8a, 8b, respectively, exposing the surface of silicon substrate 1. Thus, sidewall oxide films 6a, 6b are respectively formed. Further, upon forming recessed portions 8a, 8b, the duration time of heat treatment must be set so that gate electrode 5a does not electrically short-circuit with source/drain electrodes 7a, 7b, and that both side surfaces of gate electrode 5 remain unexposed.

Figure 8:
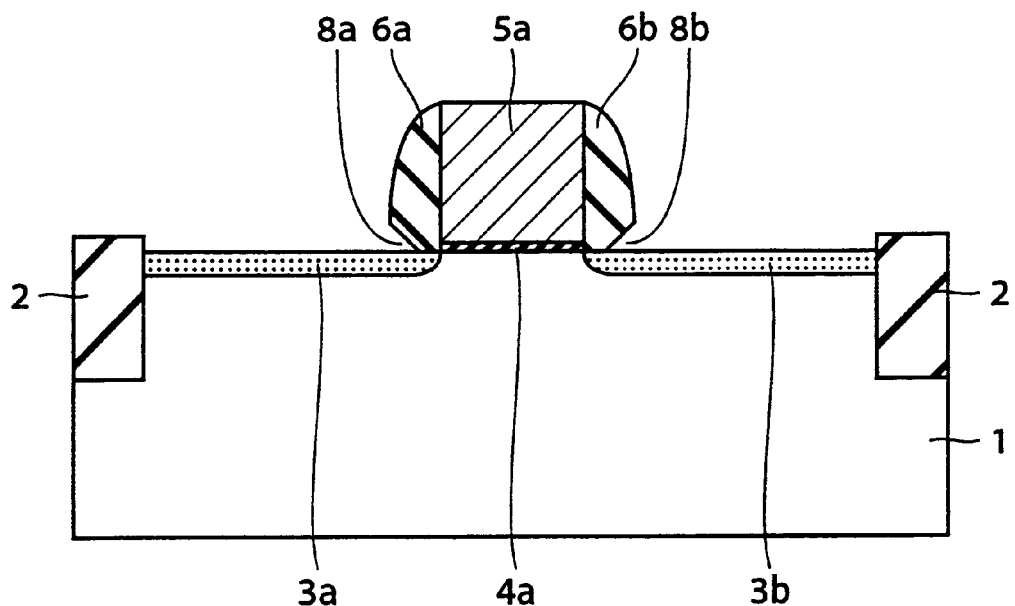
FIG. 8 is a cross sectional view showing the step performed after the step shown in FIG. 7 according to the second embodiment.

Then, as shown in FIG. 8, a pair of source/drain diffusion regions 3a, 3b are respectively formed by implanting an n-type impurity such as phosphorus ions into silicon substrate 1 by ion implantation method at 10 KeV with a dosage of $4\times10^{14}/cm^2$.

Figure 9:
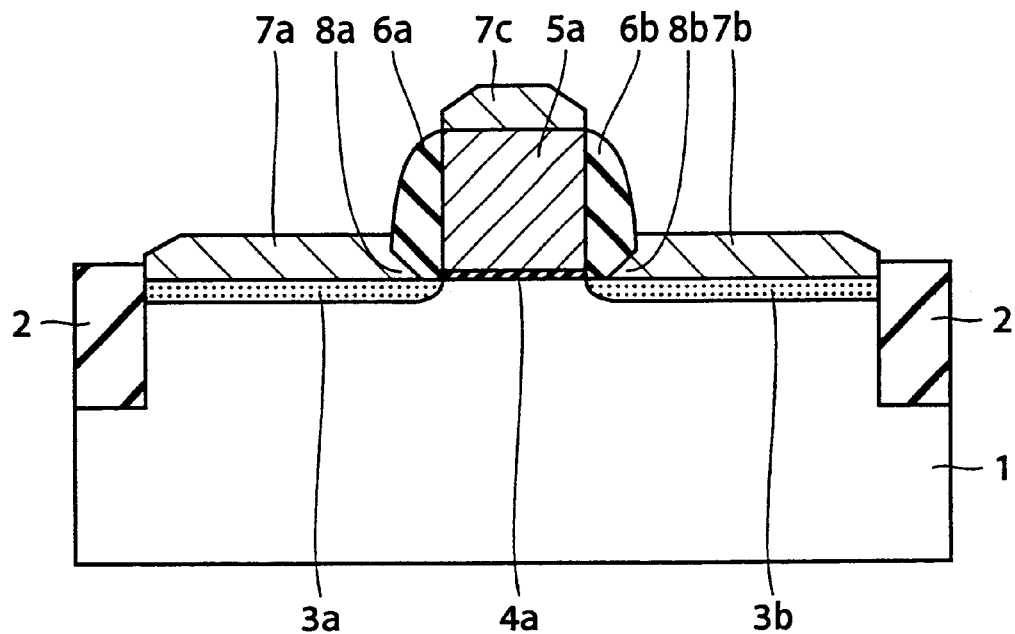
FIG. 9 is a cross sectional view showing the step performed after the step shown in FIG. 8 according to the second embodiment.

Next, as shown in FIG. 9, the silicon is epitaxially grown at 650° C. in the disilane ($Si_2H_6$) gas ambient to form source/drain electrodes 7a, 7b on source/drain diffusion regions 3a, 3b, respectively, filling recessed portions 8a, 8b. At the same time, a gate upper electrode 7c is formed on the upper surface of gate electrode 5a. In this manner, the main portion of the semiconductor device having a field-effect transistor is completed.

According to the above-described method of manufacturing the semiconductor device, recessed portions 8a, 8b are respectively formed in the sidewall oxide films in the step shown in FIG. 7. Then, in the step shown in FIG. 8, source/drain electrodes 7a, 7b are formed filling recessed portions 8a, 8b, which results in source/drain electrodes 7a, 7b being formed between sidewall oxide films 6a, 6b and source/drain diffusion regions 3a, 3b located beneath sidewall oxide films 6a, 6b.

Therefore, when compared with the conventional semiconductor device in which source/drain electrodes are not formed in the regions between the sidewall oxide films and source/drain diffusion regions 3a, 3b, the formation of source/drain electrodes 7a, 7b, respectively, in such regions allows the sheet resistance of source/drain diffusion regions 3a, 3b and source/drain electrodes 7a, 7b to be further reduced. Consequently, the current flowing through source/drain diffusion regions 3a, 3b and source/drain electrodes 7a, 7b increases, and a semiconductor device provided with a transistor having a greater current drivability can be easily produced.

Recessed portions 8a, 8b are formed by removing the portions having suffered more damage while sidewall oxide films 6c, 6d are formed by anisotropically etching the silicon oxide film in the step shown in FIG. 6. Since the film quality in the damaged portions is degraded in that the bond strength of the film is weakened in comparison with other portions, the damaged portions readily vaporize from the above-described heat treatment, forming recessed portions 8a, 8b. While the heat treatment was effected at 900° C. at $1\times10^{-8}$ Torr in the above example, experiments have shown that the damaged portions readily vaporize at a temperature of 850° C. or above, at $1\times10^{-6}$ Torr or below.

Alternatively, isotropic etching may be used to remove the damaged portions. Thus, recessed portions 8a, 8b can be easily formed by dipping silicon substrate 1 in a hydrofluoric acid aqueous solution having a water-to-hydrofluoric acid ratio of 100 to 1, since the damaged portions, having a greater etching rate than other portions, are etched faster.

Moreover, in this case, the etching time must be set such that both side surfaces of gate electrode 5a remains unexposed.

In addition, while silicon oxide films are used as sidewall oxide films 6a, 6b above, silicon nitride films or silicon oxynitride films may alternatively be used to form the recessed portions in a similar manner. As to the respective film denseness of the silicon oxide film, silicon oxynitride film, and silicon nitride film, the denseness increases in the given order, with the silicon oxide film being the least dense. Therefore, when using isotropic etching to form the recessed portions, the fastest etching rate is achieved with the silicon oxide film, which allows recessed portions 8a, 8b to be formed without difficulty.

Figure 10:
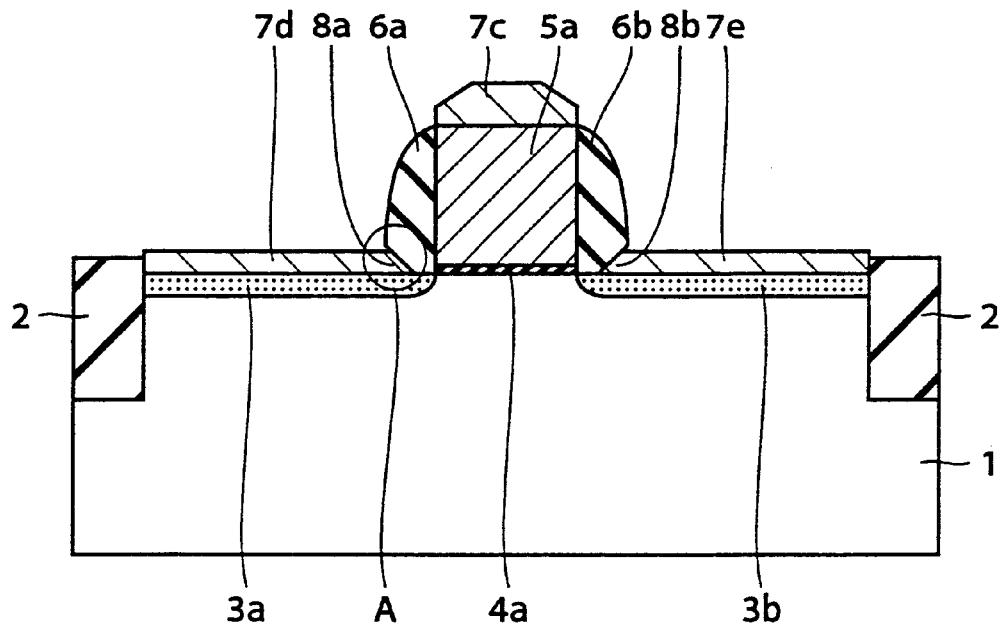
FIG. 10 is a cross sectional view for describing in further detail the step shown in FIG. 9 according to the second embodiment.

Furthermore, when forming source/drain electrodes 7a, 7b respectively by epitaxial growth method in the step shown in FIG. 9, it is desirable to effect the growth such that voids are not formed in recessed portions 8a, 8b in the growth process. Therefore, as shown in FIG. 10, at the initial stage of epitaxial growth, the flow rate of disilane, for example, is set at a relatively small value of approximately 0.25 sccm in order to prevent the voids from forming in the portion indicated by A in the Figure. Consequently, faceting does not occur at the edge portions of the growing silicon, and the formation of the voids can be prevented. Then, after the upper surface of the growing silicon have grown beyond recessed portions 8a, 8b, the flow rate of disilane is set at a larger value, for example, of about 2 sccm. In this manner, as shown in FIG. 9, facets are formed at edge portions of the growing silicon, and source/drain electrodes 7a, 7b are formed with greater speed. In addition, it has been found, at 650° C., that faceting occurs at the edge portions of the growing silicon when the flow rate of disilane exceeds approximately 0.5 sccm. As described above, by preventing the voids from forming in the vicinity of the transistor, the reliability of the transistor is improved.

Moreover, when source/drain electrodes 7a, 7b are formed by silicon epitaxial growth method, the silicon is epitaxially grown inside an appropriate chamber directly after the formation of the recessed portions by the heat treatment effected inside the same chamber. Thus, falling of foreign particles on silicon substrate 1 that occurs during the transportation of the wafer, such as upon its removal from the chamber, can be prevented, which leads to a stable epitaxial growth of the silicon, and thus, an improved film quality.

Third Embodiment

Figure 11:
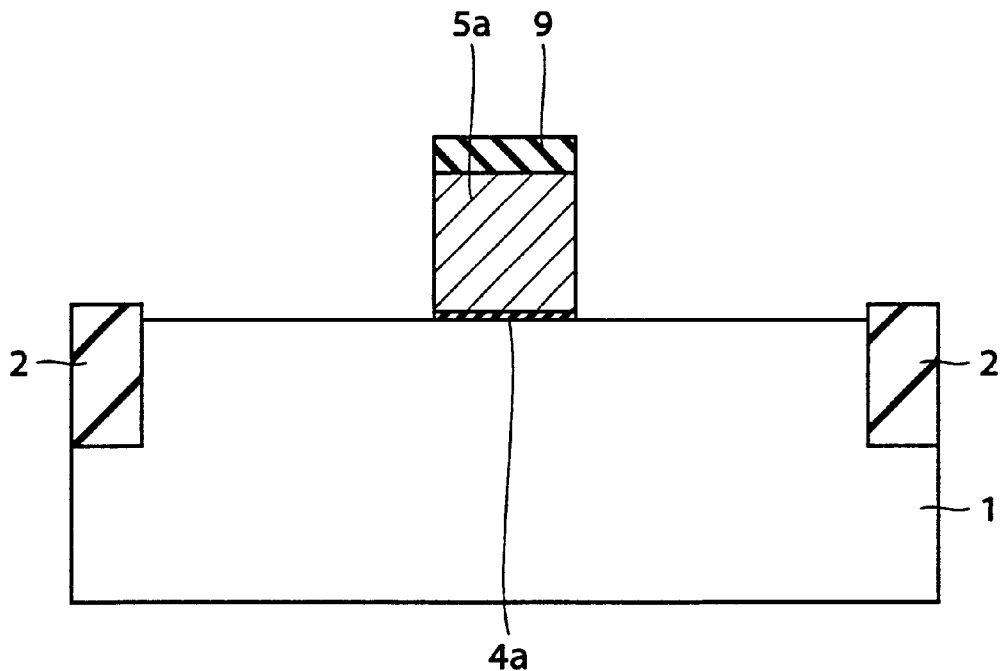
FIG. 11 is a cross sectional view showing a step of the manufacturing method of the semiconductor device according to the third embodiment of the present invention.

Now, the method of manufacturing the semiconductor device according to the third embodiment of the present invention will be described with reference to the drawings. After the steps shown in FIGS. 2 and 3 described in relation to the second embodiment, a polysilicon film (not shown) is formed on a silicon oxide film 4 by CVD method. On the polysilicon film, a silicon oxide film (not shown) is formed by CVD method. A prescribed photo resist pattern (not shown) is formed on the silicon oxide film. Then, as shown in FIG. 11, using the photo resist pattern as a mask, the silicon oxide film is etched anisotropically to form a silicon oxide film 9. Further, using silicon oxide film 9 and the photo resist pattern as a mask, the polysilicon film is etched anisotropically to form a gate oxide film 4a and a gate electrode 5a.

Figure 12:
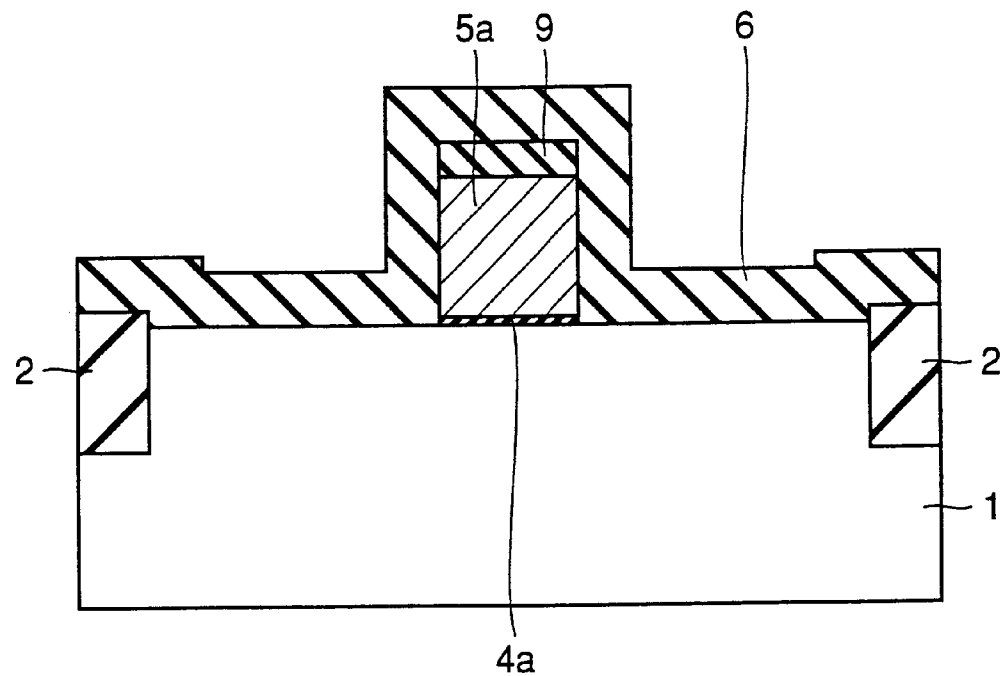
FIG. 12 is a cross sectional view showing the step performed after the step shown in FIG. 11 according to the third embodiment.
Figure 13:
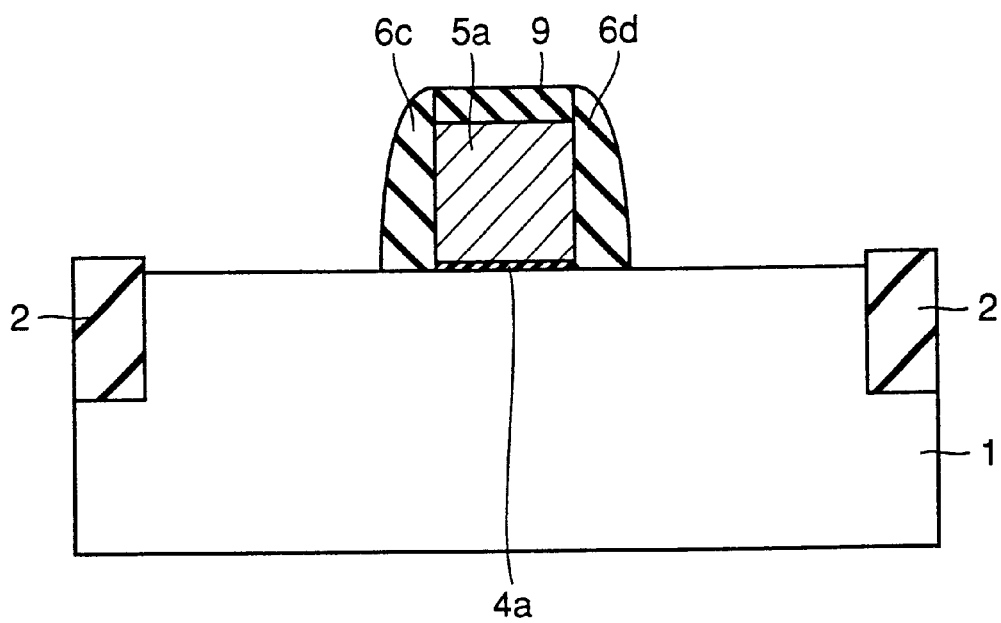
FIG. 13 is a cross sectional view showing the step performed after the step shown in FIG. 12 according to the third embodiment.

Then, as shown in FIG. 12, a silicon oxide film 6 is formed on silicon substrate 1 by CVD method, covering gate electrode 5a and silicon oxide film 9. Then, as shown in FIG. 13, silicon oxide film 6 is etched anisotropically to form sidewall oxide films 6c, 6d, one on each side over the side surfaces of gate electrode 5a and silicon oxide film 9.

Figure 14:
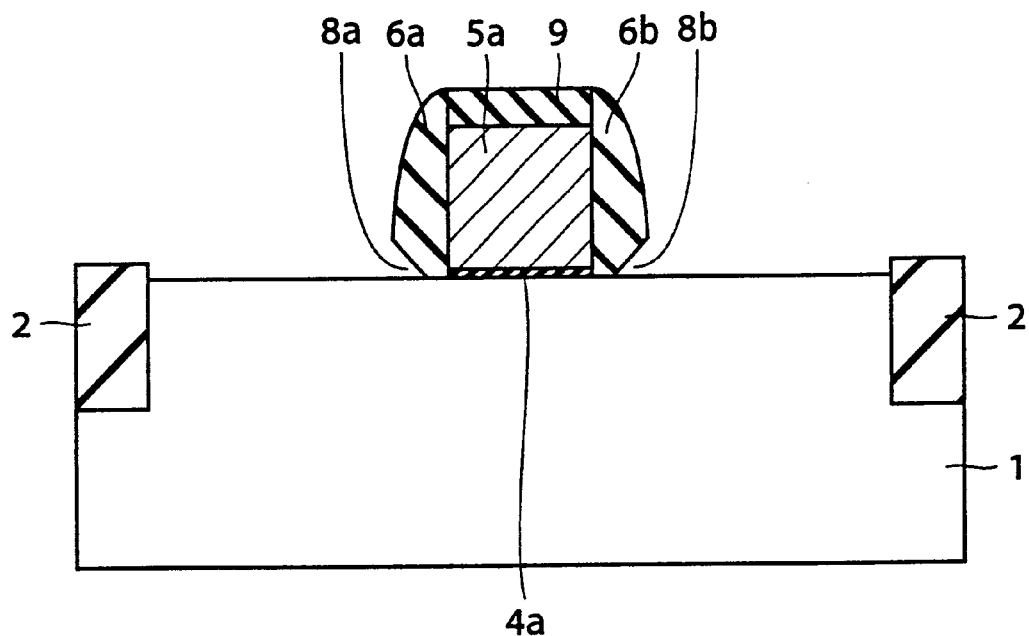
FIG. 14 is a cross sectional view showing the step performed after the step shown in FIG. 13 according to the third embodiment.
Figure 15:
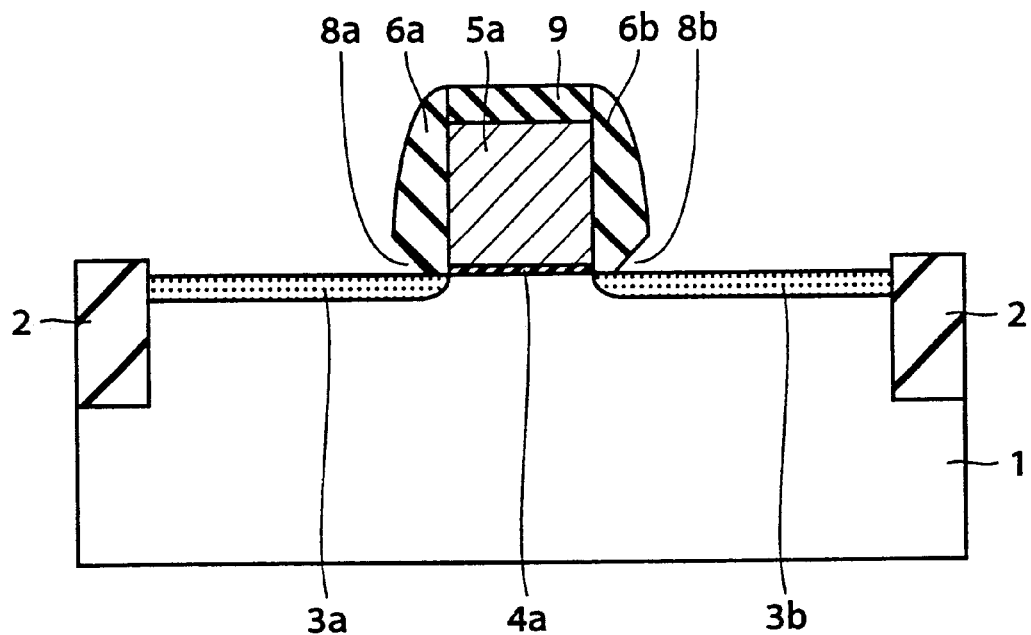
FIG. 15 is a cross sectional view showing the step performed after the step shown in FIG. 14 according to the third embodiment.

Next, as shown in FIG. 14, recessed portions 8a, 8b are respectively formed by an appropriate heat treatment or isotropic etching in a manner analogous to the step shown in FIG. 7 described in relation to the second embodiment. Thus, sidewall oxide films 6a, 6b are formed. Then, as shown in FIG. 15, a pair of source/drain diffusion regions 3a, 3b are formed, respectively, by introducing an n-type impurity such as phosphorus into silicon substrate 1 by ion implantation method.

Figure 16:
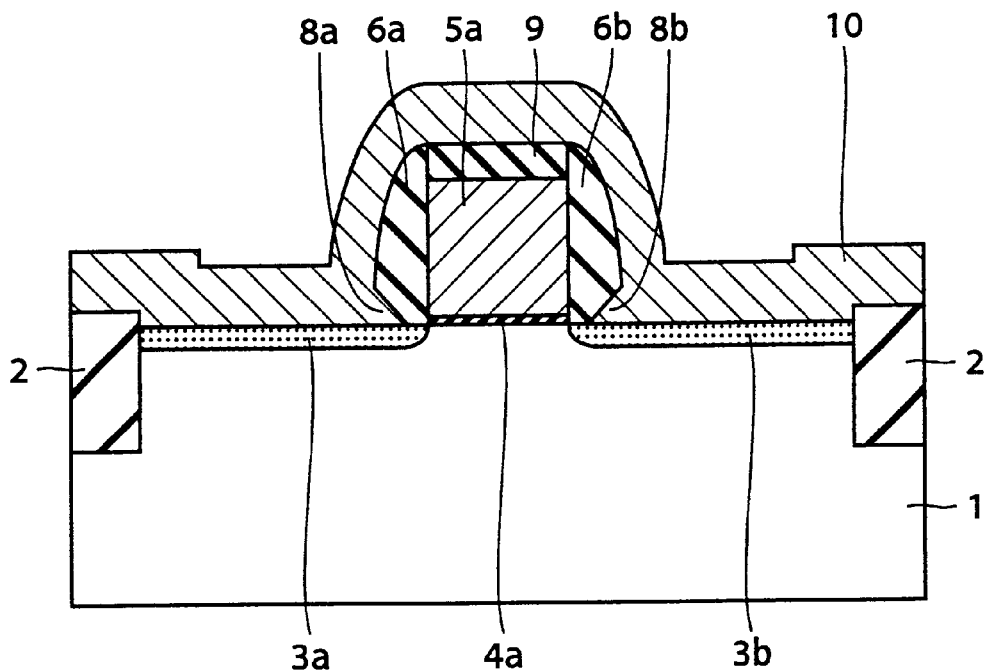
FIG. 16 is a cross sectional view showing the step performed after the step shown in FIG. 15 according to the third embodiment.

Then, as shown in FIG. 16, a doped polysilicon film 10, for example, doped with phosphorus, is formed on silicon substrate 1 by a CVD method such as plasma enhanced CVD method so as to cover sidewall oxide films 6a, 6b and gate electrode 5a. Moreover, it is desirable that the impurity with which the polysilicon film is doped is an impurity of the same conductivity type as the conductivity type of source/drain diffusion regions 3a, 3b.

Figure 17:
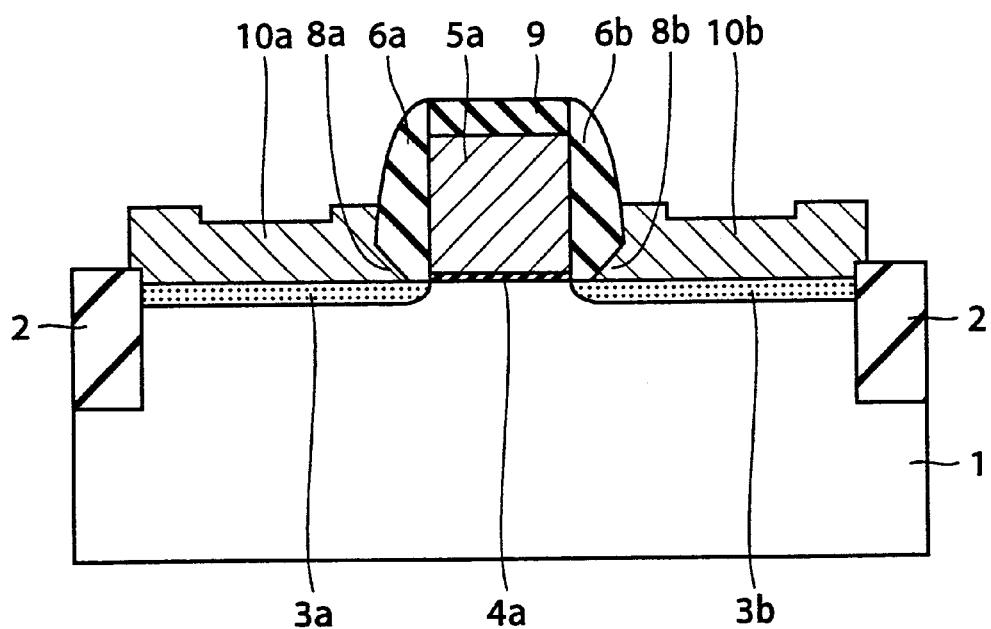
FIG. 17 is a cross sectional view showing the step performed after the step shown in FIG. 16 according to the third embodiment.

Next, as shown in FIG. 17, a prescribed photo resist pattern (not shown) is formed on doped polysilicon film 10, and using the photo resist pattern as a mask, doped polysilicon film 10 is etched anisotropically to form source/drain electrodes 10a, 10b, respectively, which are electrically connected to source/drain diffusion regions 3a, 3b. From the above steps, the main portion of the semiconductor device having a transistor is completed.

Since source/drain electrodes 10a, 10b, respectively, are formed between sidewall oxide films 6a, 6b and source/drain diffusion regions 3a, 3b beneath sidewall oxide films 6a, 6b similarly in the transistor formed by the above-described manufacturing method, the sheet resistance of source/drain electrodes 10a, 10b and source/drain diffusion regions 3a, 3b is reduced, which allows the transistor having a greater current drivability to be produced with ease, as described in relation to the second embodiment.

Although the silicon formed by epitaxial growth or CVD method is used as source/drain electrodes 7a, 7b, 10a, 10b in the second and third embodiments, silicon germanium or a stacked film of silicon germanium and silicon may be alternatively used. Moreover, a metal such as titanium, tungsten, copper, aluminum, cobalt, nickel, tantalum, or molybdenum may also be used. Furthermore, the sheet resistance of source/drain diffusion regions 3a, 3b and source/drain electrodes 10a, 10b can be further reduced from the use of a metal silicide film such as a titanium silicide film obtained from reacting titanium with the silicon in the silicon substrate by an appropriate heat treatment. Thus, the current drivability of the transistor is further improved.

When using a metal silicide as source/drain electrodes 7a, 7b, source/drain electrodes 7a, 7b can be easily formed in a self-aligned manner on source/drain diffusion regions 3a, 3b by reacting the silicon in silicon substrate 1 with a metal by an appropriate heat treatment.

In addition, although a method such as epitaxial growth or CVD is used to form source/drain electrodes 7a, 7b, 10a, 10b in the second and third embodiments, MBE (Molecular Beam Epitaxy) method or ICB (Ion Cluster Beam) method may alternatively be used. Further, when a metal is used for source/drain electrodes 7a, 7b, 10a, 10b, the metal can be deposited by sputtering.

Source/drain electrodes 7a, 7b, 10a, 10b may be formed by adding an impurity of the same conductivity type as the conductivity type of source/drain diffusion regions 3a, 3b during the silicon growth process. Addition of an impurity of a prescribed conductivity type to source/drain electrodes 7a, 7b, 10a, 10b, for example, by ion implantation method, however, may take place after source/drain electrodes 7a, 7b, 10a, 10b are formed.

Furthermore, although in the second and third embodiments source/drain diffusion regions 3a, 3b are formed prior to the formation of source/drain electrodes 7a, 7b, 10a, 10b, source/drain diffusion regions 3a, 3b may also be formed by first forming source/drain electrodes 7a, 7b, 10a, 10b containing an impurity of a prescribed conductivity type, and thereafter diffusing the impurity contained in source/drain electrodes 7a, 7b, 10a, 10b into the silicon substrate.

Figure 18:
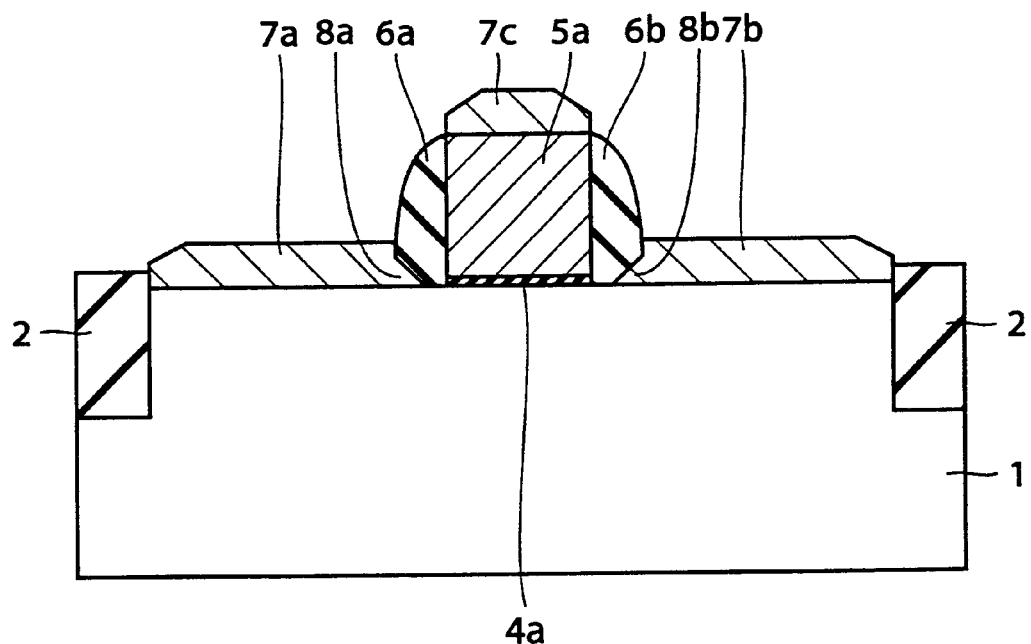
FIG. 18 is a cross sectional view of a step for describing a variation in the second embodiment or the third embodiment of the present invention.
Figure 19:
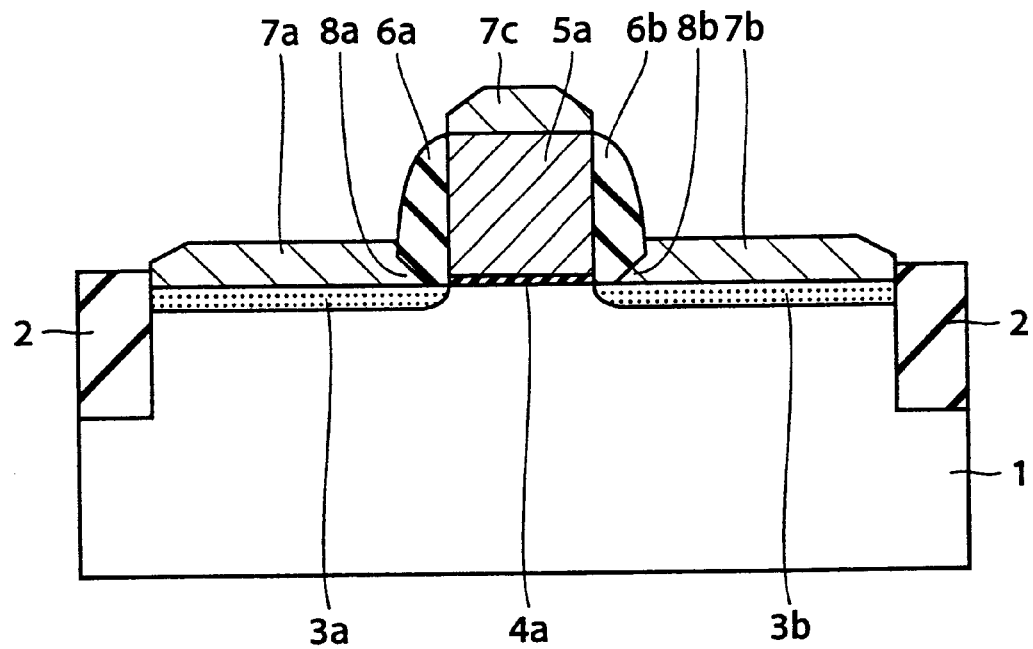
FIG. 19 is a cross sectional view showing the step performed after the step shown in FIG. 18.

Thus, in the step shown in FIG. 18, source/drain electrodes 7a, 7b containing an impurity of the same conductivity type as that of source/drain diffusion regions are formed on silicon substrate 1. Then, as shown in FIG. 19, a pair of source/drain diffusion regions 3a, 3b are formed by diffusing into silicon substrate 1 the impurity contained in source/drain electrodes 7a, 7b through an appropriate heat treatment. The same effects as those described in relation to the second and third embodiments is obtained from a transistor thus formed.

Figure 20:
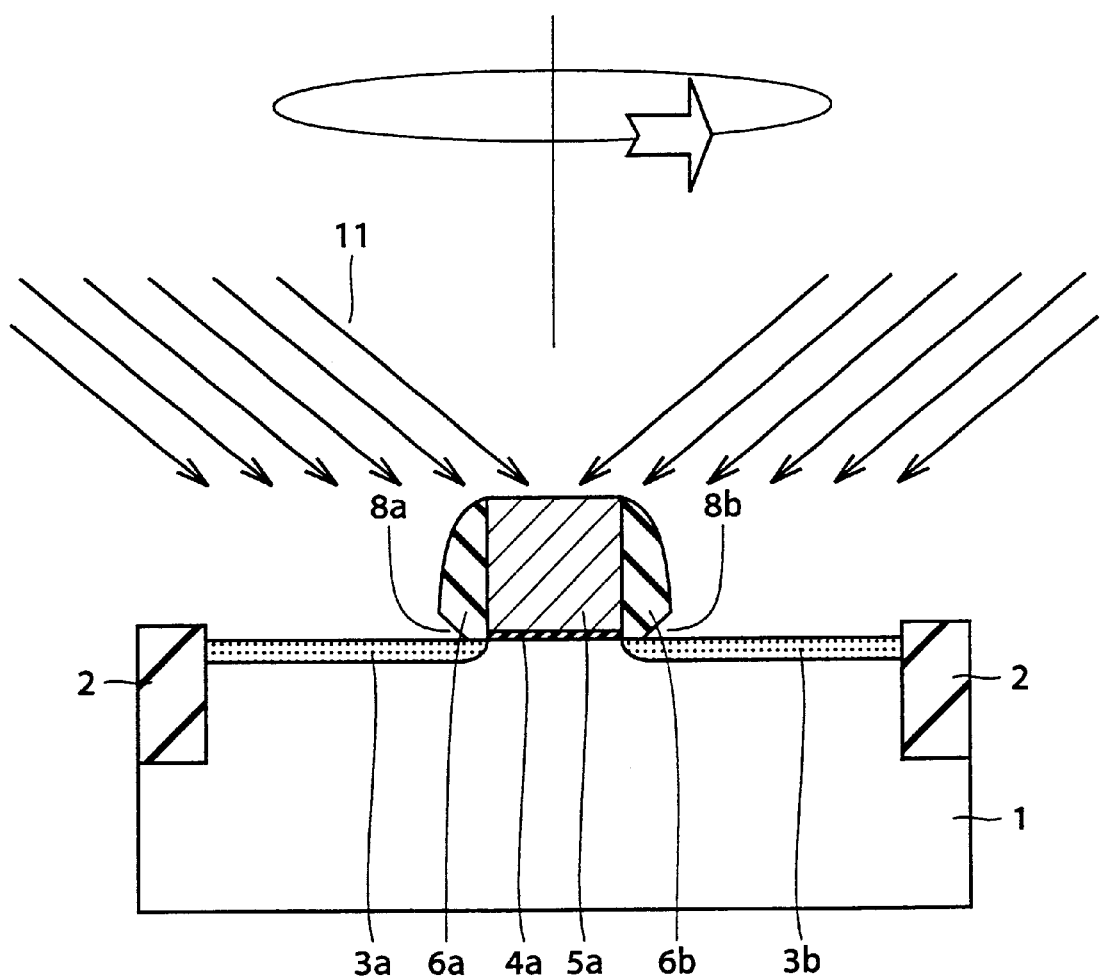
FIG. 20 is a cross sectional view showing a preferred step according to the second embodiment or the third embodiment.
Figure 21:
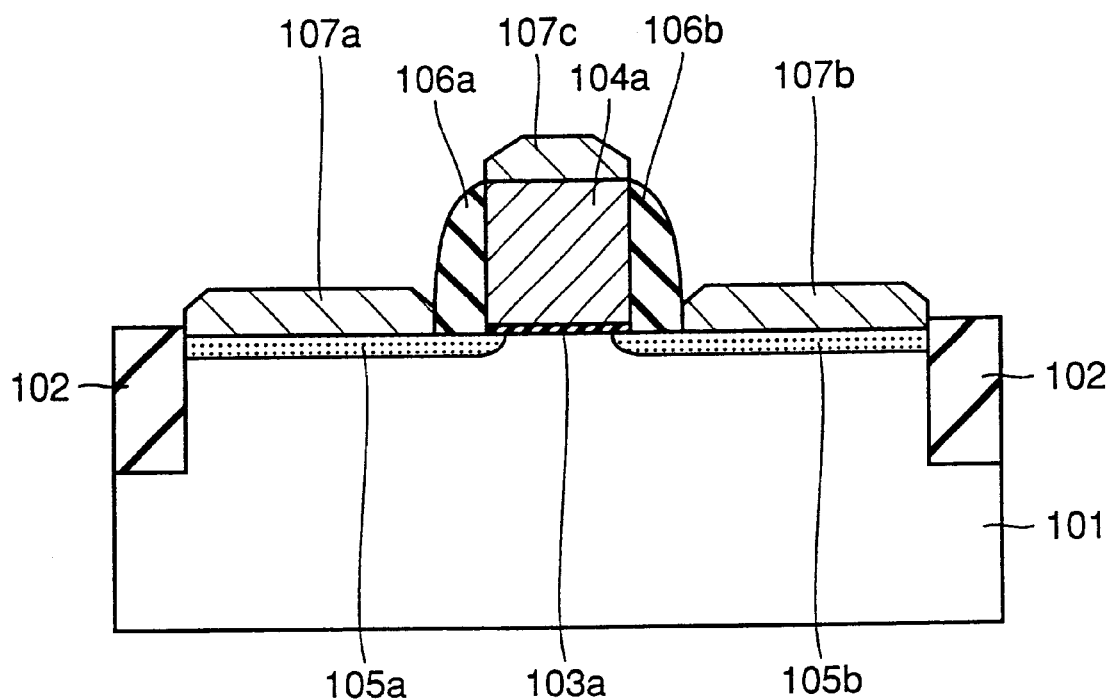
FIG. 21 is a cross sectional view of a conventional semiconductor device.
Figure 22:
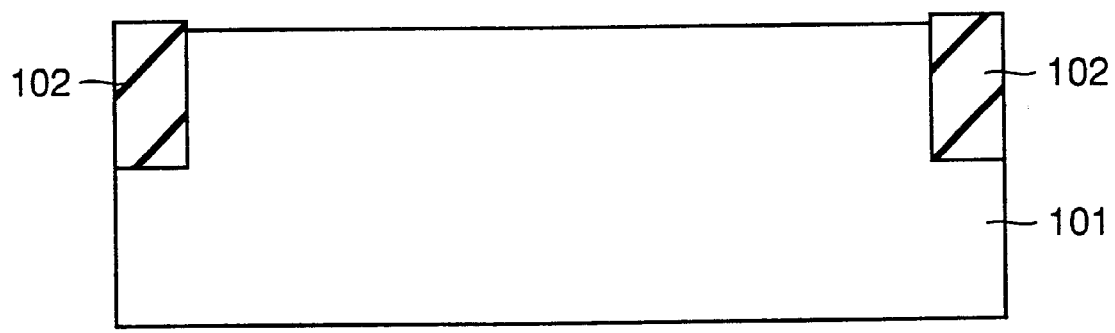
FIG. 22 is a cross sectional view showing a step of the manufacturing method of the conventional semiconductor device.
Figure 23:
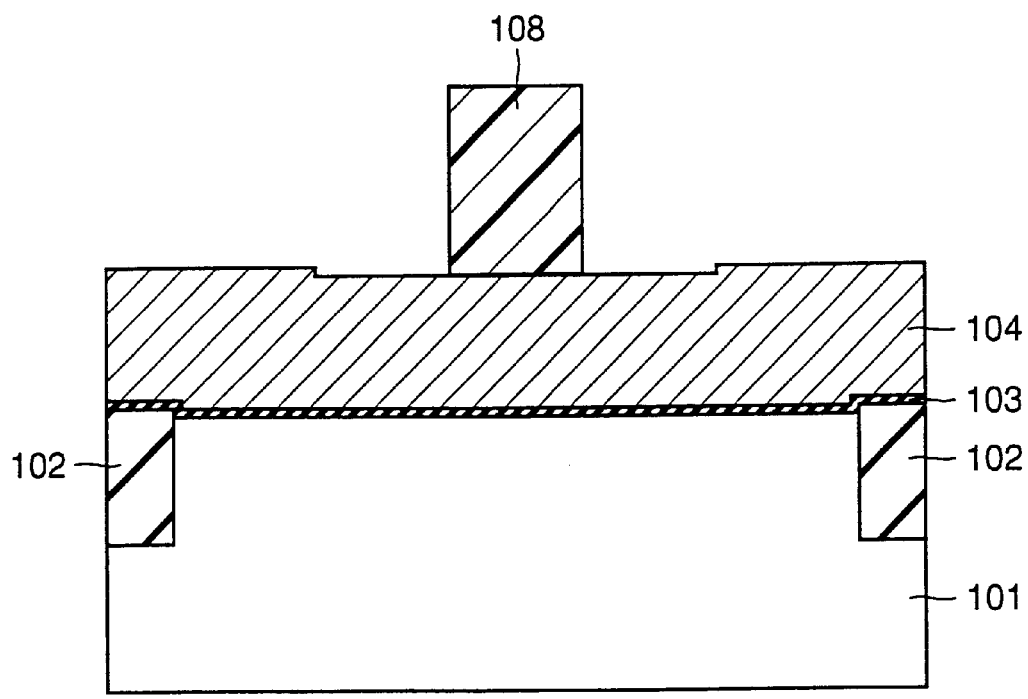
FIG. 23 is a cross sectional view showing the step performed after the step shown in FIG. 22.
Figure 24:
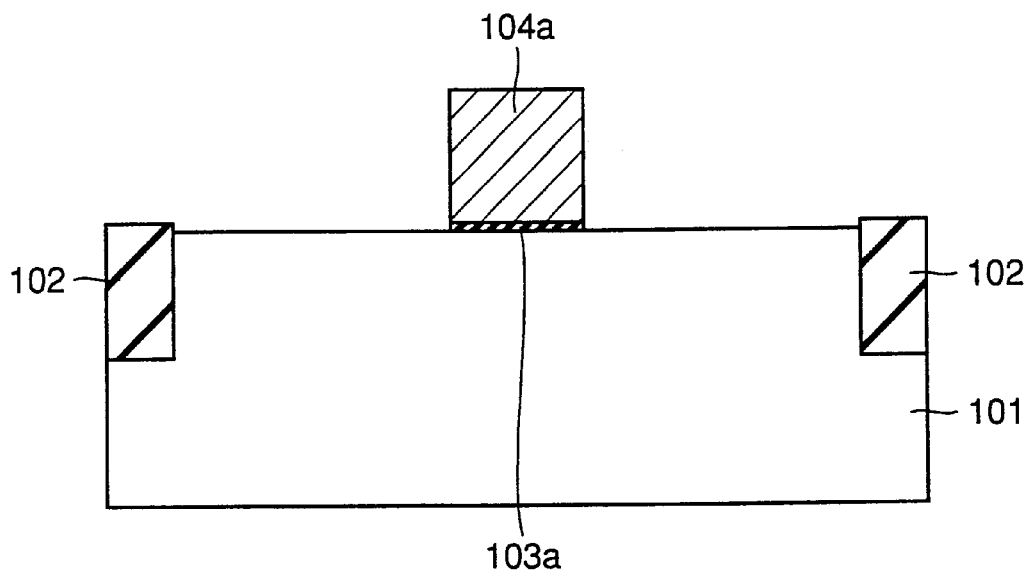
FIG. 24 is a cross sectional view showing the step performed after the step shown in FIG. 23.
Figure 25:
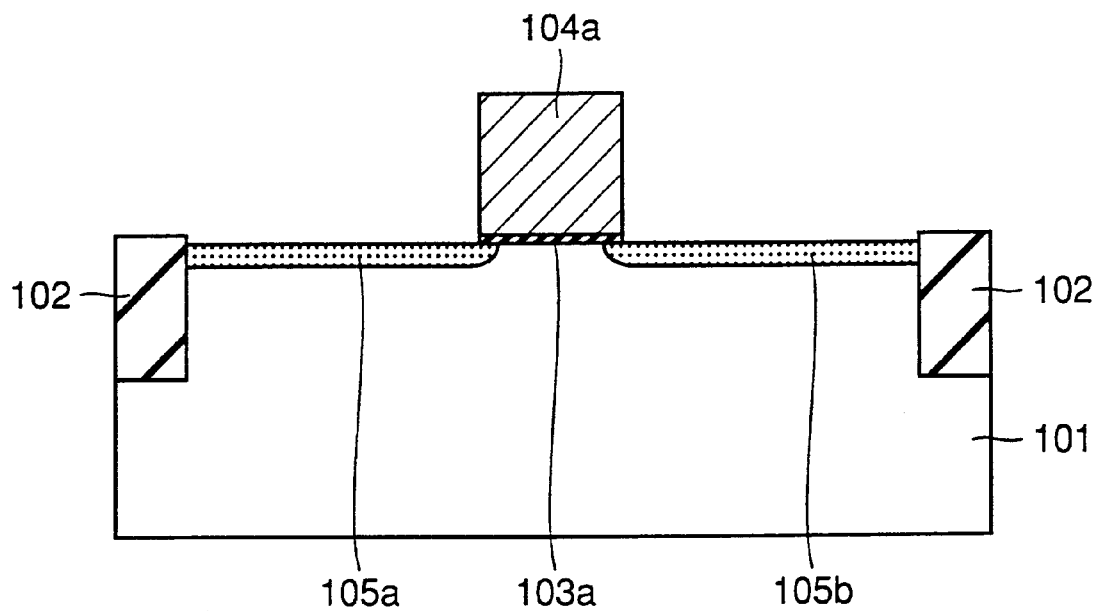
FIG. 25 is a cross sectional view showing the step performed after the step shown in FIG. 24.
Figure 26:
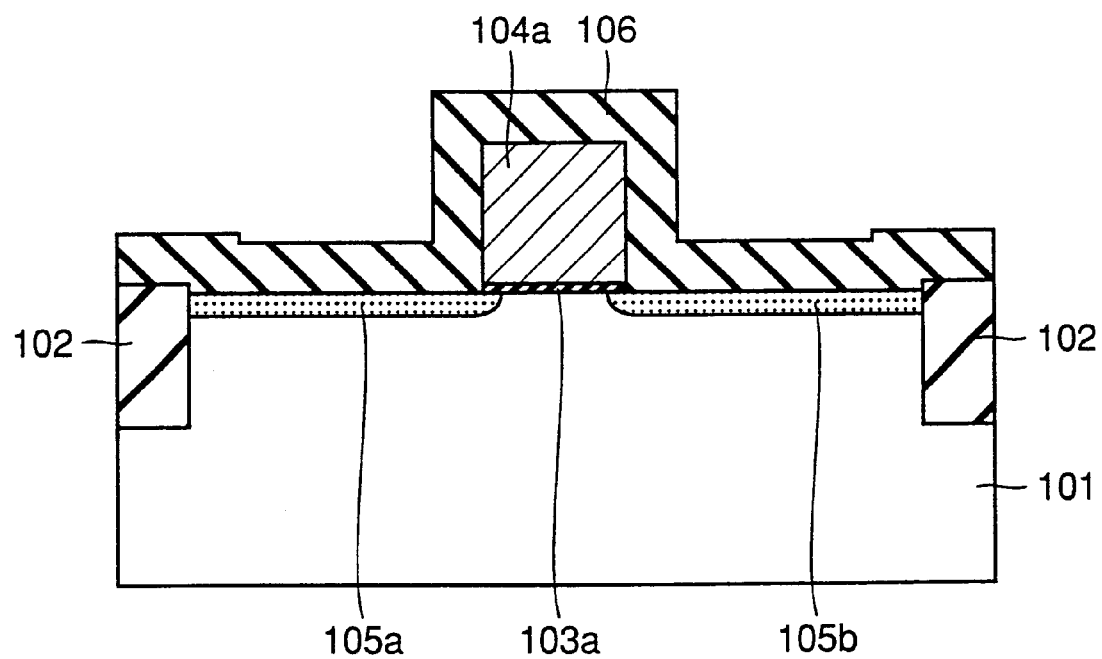
FIG. 26 is a cross sectional view showing the step performed after the step shown in FIG. 25.
Figure 27:
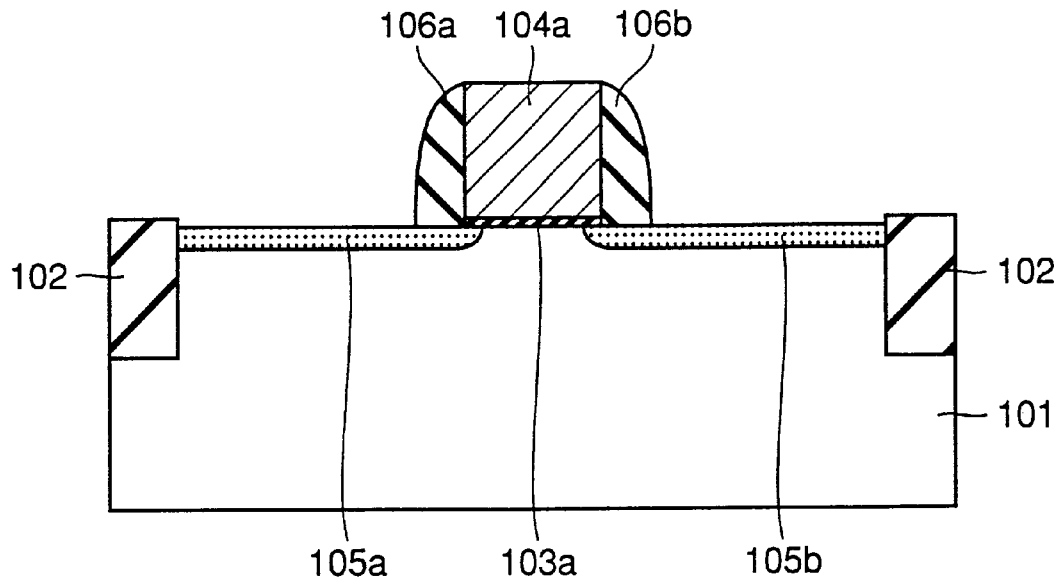
FIG. 27 is a cross sectional view showing the step performed after the step shown in FIG. 26.

In addition, when source/drain diffusion regions 3a, 3b are formed by ion implantation method in the step shown in FIG. 8 described in relation to the second embodiment, source/drain diffusion regions 3a, 3b may be formed by implanting the impurity ions of a prescribed conductivity type by oblique rotational ion implantation with the angle of incidence chosen such that the ions are not blocked by sidewall oxide films 6a, 6b as shown in FIG. 20. In this case, the impurity is introduced into the surface of silicon substrate 1 exposed by recessed portions 8a, 8b without being blocked by sidewall oxide films 6a, 6b.

In the above-described manufacturing method, the portions of the sidewall oxide films near the surface of silicon substrate 1 suffer more damage than other portions during the formation of the sidewall oxide film. Since such damaged portions have undergone degradation in the film quality such as weakening of the film bond strength, the damaged portions can be easily removed by heat treatment or isotropic etching to form recessed portions 8a, 8b. Thus, in comparison with a conventional semiconductor device not having such recessed portions, the present semiconductor device having source/drain electrodes 7a, 7b formed on silicon substrate 1 filling recessed portions 8a, 8b allows a further reduction in the sheet resistance of source/drain diffusion regions 3a, 3b and source/drain electrodes 7a, 7b, which results in an improved current drivability and operation speed of the transistor.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:

a semiconductor substrate having a main surface;

an electrode formed on said main surface of said semiconductor substrate with an insulating film therebetween;

a pair of conductive regions formed on said semiconductor substrate such that said pair of conductive regions sandwich said electrode from both sides; and sidewall insulating films each formed as a single layer, one on a respective side surface of said electrode, in contact with said electrode, and having a recessed portion formed which exposes said main surface of said semiconductor substrate, each recessed portion having an upper edge, wherein said pair of conductive regions include impurity respectively formed on said main surface of said semiconductor substrate such that said impurity formed conductive regions sandwich said electrode from both sides, and conductive layers formed on said impurity formed conductive regions to fill said recessed portions, said conductive layers formed using the same material from a surface of said semiconductor substrate to a height that is beyond the upper edges of said recessed portions, said material in contact with said sidewall insulating films above said recessed portions.

2. The semiconductor device according to claim 1, wherein said semiconductor substrate is a silicon single crystal substrate, and said conductive layers are epitaxially grown silicon or silicon germanium.

3. The semiconductor device according to claim 1, wherein said conductive layers contain a metal.

4. The semiconductor device according to claim 3, wherein said semiconductor substrate is a silicon substrate, and said conductive layers contain a metal silicide formed by reacting silicon in said silicon substrate with said metal.

5. The semiconductor device according to claim 1, wherein the conductive layers are formed of one of epitaxially grown silicon and epitaxially grown silicon germanium.

6. The semiconductor device according to claim 1, wherein the conductive layers are formed of a metal.

7. The semiconductor device according to claim 1, wherein the conductive layers are formed of a metal silicide.

* * * * *